United States Patent

Hallford

[15] 3,659,206

[45] Apr. 25, 1972

[54] MICROWAVE BALANCED MIXER CIRCUIT

[72] Inventor: Ben R. Hallford, Dallas, Tex.

[73] Assignee: Collins Radio Company, Dallas, Tex.

[22] Filed: July 16, 1970

[21] Appl. No.: 55,324

[52] U.S. Cl. ....................325/446

[51] Int. Cl. ....................H04b 1/26

[58] Field of Search ....................325/442, 445, 446, 448, 449, 325/123, 124, 138, 329; 329/160–164; 332/52; 333/84 M, 25, 4, 5

[56] References Cited

UNITED STATES PATENTS

| | | | |
|---|---|---|---|
| 2,269,640 | 1/1942 | Thom | 325/124 |
| 2,563,591 | 8/1951 | Edwards | 325/446 |
| 3,310,748 | 3/1967 | Putnam | 325/446 |
| 3,437,935 | 4/1969 | Webb | 325/446 |
| 3,512,091 | 5/1970 | Blixt et al | 325/446 |

*Primary Examiner*—Albert J. Mayer

*Attorney*—Warren H. Kintzinger and Robert J. Crawford

[57] ABSTRACT

A balanced microwave mixer for converting a microwave input signal to an intermediate frequency output using a microwave carrier as a local oscillator signal with the two microwave signals combined and divided out through two signal carrier lines via a hybrid "rat race" circuit ring. The two signal carrier lines are connected respectively one to the anode of a mixer diode and the other to the cathode of another mixer diode the opposite IF side electrodes of which are dc circuit interconnected via IF output circuitry connected thereto. Harmonic suppression filters are employed both at the inputs and outputs of the mixer diodes, and input signal quarter wavelength long outer end grounded stubs are also provided closely adjacent the mixer diodes on the RF signal input sides thereof. Low impedance RF termination stubs are provided at the diode IF outputs with each connected to an IF combining RF reactive one-quarter RF signal wavelength long stub through high impedance lines of similar length and, further, a high impedance line of similar length interconnects the IF combining stub to an RF rejection filter in turn connected to an IF amplifier.

17 Claims, 4 Drawing Figures

Figure 1:
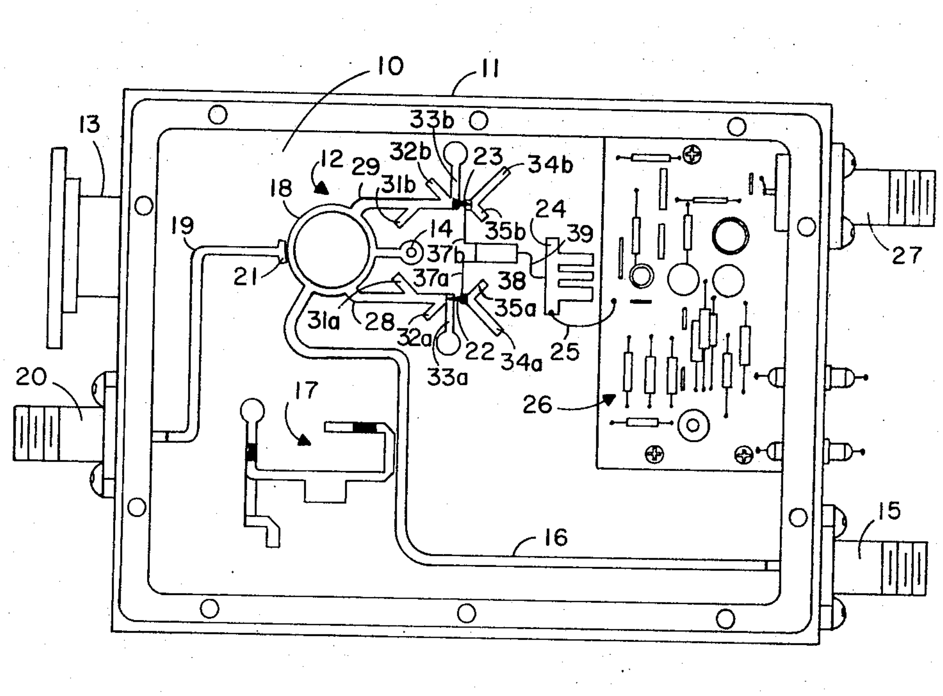

INVENTOR.
BEN R. HALLFORD
BY Warren H. Kintzinger
ATTORNEY

INVENTOR.
BEN R. HALLFORD

BY Warren H. Kintzinger
ATTORNEY

MICROWAVE BALANCED MIXER CIRCUIT

This invention relates in general to RF input signal to local oscillator mixers developing an intermediate frequency, and in particular, to a balanced microwave mixer converting a microwave input signal to an intermediate frequency using a microwave carrier as a local oscillator signal.

While there has been good technology employed in producing microwave waveguide mixers, there has been a need for efficient microwave microstrip and stripline circuit mixers producing a relatively low IF (intermediate frequency) output, in most instances below the microwave frequency range of operation, with a high degree of signal efficiency and an extremely low noise figure. One way that has normally been used with microstrip mixers produced herebefore is to use a considerable amount of capacity at the output of a mixer diode to provide a low RF impedance and thereby terminate RF currents at the output end of the mixer diode where the IF signal is taken. The capacity involved is normally provided in the form of a large square area of conductor directly connected to the output of the mixer diode, and with the large area conductor capacitive since it does have considerable capacity to ground. Then a high impedance line attached to the large conductor area together provide, in combination, capacity to ground coupled with the series inductance of the high impedance line, if effect a low pass filter. This commonly employed circuitry is widely used as a circuit technique for blocking RF signals from the IF circuitry. Another technique employs common output stubs for two mixer diodes in a balanced mixer with the common output stubs usually followed by a high impedance line going to an IF amplifier. In some instances harmonic filters as well as harmonic stubs and signal stubs are used at the output of the mixer diodes to provide a low impedance at that circuit location to the signal and harmonic frequencies with, however, this circuit arrangement not providing completely satisfactory IF output with minimal loss to the RF signals including fundamental as well as harmonic signals. In another mixer approach IF signal product is taken from mixer diodes through an IF transformer bridging the output of the two diodes in a balanced mixer with the two signals thereby combined in what is, essentially, a balanced to unbalanced transformer providing a connection between the balanced output of the mixer diodes to the unbalanced input of an IF amplifier with a single pair of input terminals. This approach does introduce RF signal loss and there is a degradation of the noise figure. With all of these mixers used heretofore harmonics that are generated through the mixer diodes and the signal frequencies themselves are not adequately reflected back to the mixer diodes at the inputs and outputs thereof with resulting losses being introduced that appear as a degradation in the mixer noise figure. With a balanced mixer using a transformer to IF signal coupling system two mixer diodes are connected in the same direction to be essentially in parallel with combined currents from the two mixer diodes flowing to the IF circuitry with a dc return provided therefrom to ground. This transformer approach disadvantageously increases conversion loss in the transformation from RF to IF with, as a result, the noise figure being greater than is desired. Further, this arrangement does not satisfactorily terminate harmonics at the outputs of the mixer diodes with harmonics being easily passed to an undesired degree into the IF circuit. General techniques employed in the design of mixers heretofore have emphasized broad bandwidths whereas applicant in this instant has taken an approach emphasizing good performance, that is, the provision of a low noise figure with, in the attainment thereof, some measure of bandwidth being sacrificed and, as a result, an extremely low noise figure being achieved along with a bandwidth of approximately 15 percent.

It is, therefore, a principal object of this invention to provide a highly efficient balanced microwave mixer with low signal input loss and a very low noise figure.

Another object with such a balanced microwave mixer is optimized harmonic energy return rather than loss and to terminate signal frequency at mixer diode IF outputs.

A further object is to achieve low signal conversion loss through the mixer diodes through the frequency range of operation desired along with low diode mount package reactance.

Another object is to minimize RF current flow to the output IF circuitry from the mixer diodes.

Still another object is have IF current flow through the mixer diodes with minimal transmission of IF back to the RF and LO (local oscillator) input circuits.

A further object is to limit mixer diode generated harmonic currents, substantially, to passage only through the mixer diodes and not into the RF or IF circuits.

Still a further object is to attain noise cancellation to a substantial degree, via use of such a balanced mixer, from the local oscillator (LO) terminals and to effectively lower IF impedance for proper mixer to transistor IF amplifier impedance matching.

Features of the invention useful in accomplishing the above objects include, in a microwave balanced mixer circuit, that may be in the form of microstrip circuitry or, alternately, in stripline circuit form, a mixer with microwave signal input and local oscillator input signal combined and divided out to two signal carrier lines to reversed mixer diodes. This is with anode of one mixer diode connected to one carrier line and the cathode of the other mixer diode connected to the other carrier line on the RF input side of the diodes in the mixer. The IF output side of the diodes are dc circuit interconnected via IF output circuitry. The mixer is, therefore, a balanced mixer with, advantageously, a very low noise figure obtained with IF currents flowing from the IF side through the mixer diodes and terminated by low impedance on the RF sides of the diodes, particularly with input signal quarter wavelength long stubs to ground on the RF sides of the diodes, and advantageously substantially no IF current flow into the RF circuits. In reverse in an analogous operational state, as related to much higher signal frequencies, RF currents flow from the RF side of the mixer through the mixer diodes to substantially completely effective termination on the IF side of the mixer diodes through relatively low RF impedance IF side terminations attained with the "V" or notched RF frequency stub and harmonic stub units connected to the respective mixer diodes.

A specific embodiment representing what is presently regarded as the best mode of carrying out the invention is illustrated in the accompanying drawings.

Figure 3:
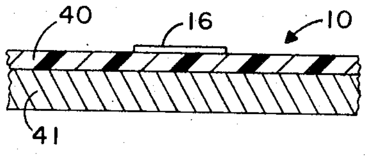
Figure 2:
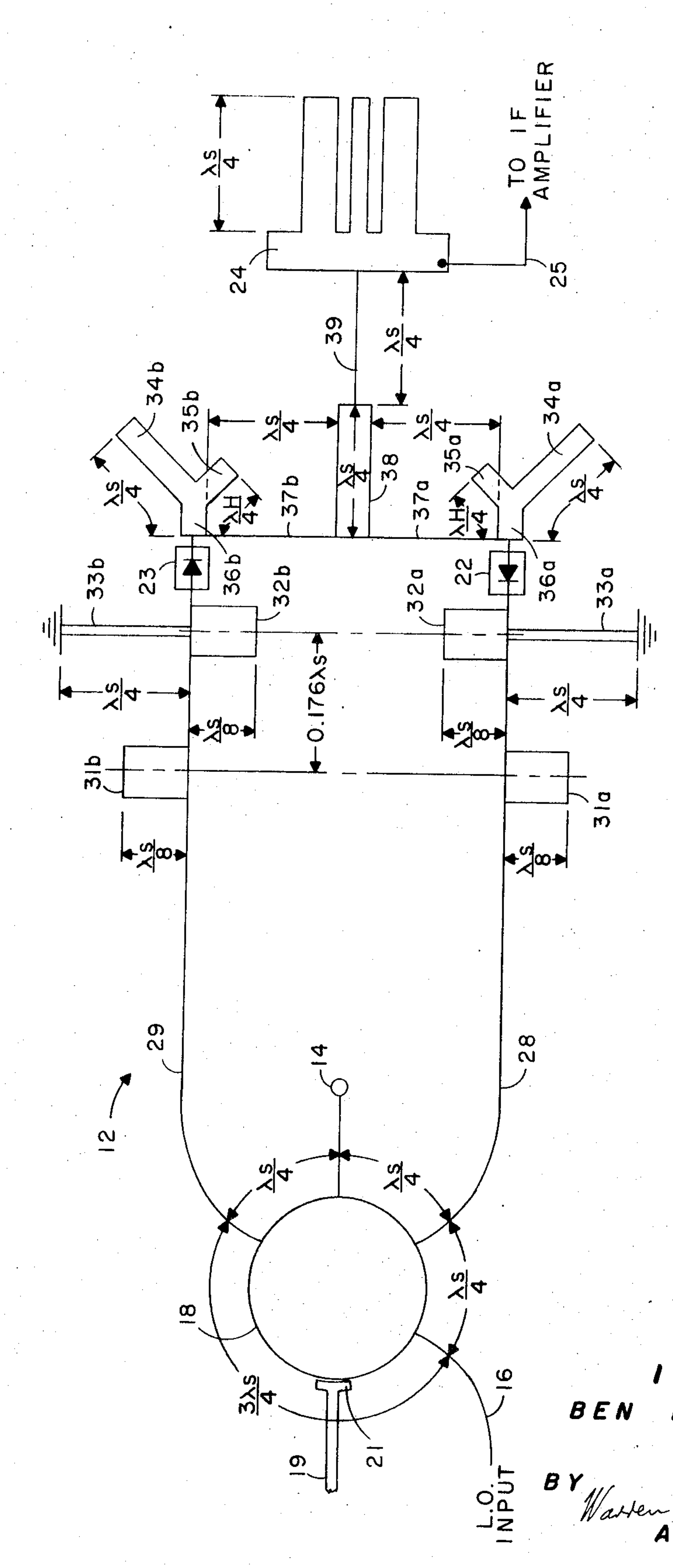

In the drawings:

FIG. 1 represents a top plan view looking down, with the box lid removed, on a shield box contained microstrip mixer and detector circuit and also an IF preamplifier circuit assembly mounted therein on and above the microstrip board;

FIG. 2, a detailed schematic showing of the microwave balanced mixer circuit portion of the circuitry of FIG. 1;

FIG. 3, a cut away and sectioned view of a portion of microstrip board; and

Figure 4:
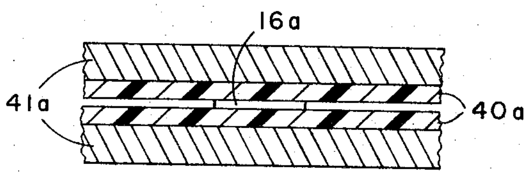

FIG. 4, a cut away and sectioned view of a portion of stripline that could also be used for such a microwave balanced mixer circuit as set forth primarily with respect to microstrip board.

Referring to the drawings

A microstrip circuit board 10 contained within shield box 11 as shown in FIG. 1 is shown to carry microwave circuitry including a balanced mixer circuit 12 signal input fed from a microwave waveguide 13 via a microwave waveguide to microstrip transition connection probe structure 14 and a local oscillator input from coaxial connection 15 through micro strip transmission line 16 that passes by a microwave detector circuit 17, of a conventional nature, to direct connection with a hybrid signal ring 18 of the balanced mixer circuit 12. An auxiliary signal input and output circuit 19 is provided, that is connectable through a wall of shield box 11 via coaxial connection 20, is capacitively coupled to the hybrid ring 18 of the balanced mixer circuit via a capacitive signal coupling end head 21. The microwave balanced diode mixer circuit 12 is provided with two reversely oriented diodes 22 and 23 that are IF output combined and interconnected with a combined output connection to an RF rejection filter 24 that, in turn, is provided with a jumper wire mixer circuit IF output wire line 25 to IF preamplifier circuit assembly 26 that is mounted within shield box 11 above the microstrip board 10. The IF preamplifier (and/or amplifiers section) 26 is provided with an output through a wall of the shield box 11 via a coaxial connection 27.

Referring also to the schematic mixer circuit showing of FIG. 2, the microwave signal input is fed from terminal 14 and the local oscillator frequency is fed through line 16 as signal input legs to hybrid signal ring 18 that isolates these two inputs and substantially equally divides their signal power between the two mixer diodes 22 and 23. This particular hybrid ring 18 is called a "rat race" and causes a 180° phase shift between the signal carrying output legs 28 and 29 feeding the mixer diodes 22 and 23. Please note, while the microwave input signal is fed from a microwave waveguide 13 through probe structure 14 and the local oscillator frequency is fed through a transmission line microstrip conductor 16, there are other combinations of waveguide, coax or other suitable transmission lines that may be employed for feeding signals to the hybrid ring 18, and that a 90° phase shift hybrid could be used in place of hybrid ring 18. The mixer circuit 12 uses harmonic suppression filters at the input and output of the mixer diodes 22 and 23 with the filters reducing the noise figure and substantially eliminating delay distortion. This is with harmonic suppression being essential in communication type mixers in order to avoid multiple reflections that otherwise cause delay distortion. The harmonic filter at the mixer diode inputs are comprised of two substantially one-eighth input signal wavelength long open-ended stubs **31*a* and 32*a* and 31*b* and 32*b* extending, respectively, from the carrier lines 28 and 29 either inwardly or outwardly at either right angles or some other angle thereto as may be desired and with the open-ended stubs, respectively, spaced substantially 0.176 of the input signal wavelength apart. Further, the open-ended stubs 32*a* and 32*b* are located closely adjacent mixer diodes 22 and 23 respectively. Still further, input signal quarter wavelength long outer end grounded stubs 33*a* and 33*b* are also provided closely adjacent the respective mixer diodes 22 and 23 respectively. These input signal quarter wavelength stubs 33*a* and 33*b* provide both an intermediate frequency (IF) return and act as a second harmonic rejection filter for the input signal. Then at the outputs of the two mixer diodes 22 and 23 respectively low RF impedance is provided via the longer stubs 34*a* and 34*b* that are substantially a quarter wavelength of the input signal frequency wavelength and the shorter stubs 35*a* and 35*b* that are in effect a branch thereof are a low impedance at the input points from the respective mixer diodes 22 and 23 for the wavelength of the sum of the input signal and local oscillator frequency and/or the second harmonic frequencies. Please note that the stubs 34*a* and 34*b* maintain their identity, respectively, with respect to shorter stubs 35*a* and 35*b* since they are in effect notched at substantially right angles to each other in extending from common signal input connective bases 36*a* and 36*b*, respectively. Please note that should the stubs 34*a* and 35*a* and 35*b* with respect to 34*b* be in a straight line configuration and at right angles to the diode connected bases 36*a* and 36*b*, respectively, that a notch be provided in line with the respective bases in order that the two stubs maintain their identity as, effectively, separate RF stubs. Please note that with this configuration having the two separate sets of output stubs 34*a* and 35*a* with base 36*a* connected to the anode of diode 22 and 34*b* and 35*b* with the base 36*b* connected to the cathode of mixer diode 23 the connections are to, respectively, low RF points of the respective output RF stub set bases 36*a* and 36*b*. This does provide much better performance than that obtained in a mixer structure with IF feed points from two mixer diodes to a common stub assembly with the connections not at the vertex of the assembled stubs and not at a low RF point thereof with, as a result, more than desired RF energy being lost into the IF lead. Also, with such a previous approach, each diode saw a different length for the same stub and these lengths were subject to varying slightly depending on the position where the diodes were mounted. By way of reiteration, it is of some measure of importance that a short section of transmission line be provided between the stubs as by notching between the stubs of each stub assembly from a stub connection base 36*a* and 36*b* to keep the electrical length of each stub the same for each diode with a notch in the line between the two stubs of each sub assembly, with this approach enabling mounting to become non-critical thereafter. The diode outputs are provided with a connection from the respective bases 36*a* and 36*b* through signal IF one-quarter wavelength long RF high impedance lines 37*a* and 37*b*, respectively, that appear as an RF signal open at their connective points to the stubs 36*a* and 36*b* and the diodes 22 and 23, to what appears as an RF short at the low impedance input end of signal quarter wavelength long open-ended IF combining stub 38. The RF open end of the signal quarter wavelength stub 38 is connected through signal quarter wavelength long high impedance line 39, that appears as an extremely high impedance at the input end thereof to RF, to effectively an RF short connection to ground via RF rejection filter 24 at the filter 24 end connection of the line 39 to the base of the three-pronged RF rejection filter 24. The low RF impedance of the RF rejection filter is transformed to a high impedance to RF by the one-quarter wavelength long impedance line 39** connected to the open end of the IF combining stub.

With reference also to the showing in FIG. 3 of a cross sectional portion of microstrip circuit board 10 taken through transmission line 16, of FIG. 1, that the conductor 16 may be typically one ounce (0.0014 inch thick) copper bonded to the upper side of polyolefin dielectric 40 approximately 0.026 inches thick having a relatively low dielectric constant of approximately 2.3 to 2.5. The relatively low dielectric constant polyolefin 40 is in turn bonded to an electrically conductive ground plane plate 41. In the mixer circuitry of FIG. 1 for a 50 ohm line a 0.080 inch line width is chosen with the one ounce copper clad being employed over the polyolefin at a dielectric thickness of 0.026 inches with the dielectric constant being about 2.3. With the circuit as adapted to stripline, such as illustrated in FIG. 4, the bulk of the mixer circuitry 16a would be sandwiched between dielectric material layers **40*a* in turn bonded to respective electrically conductive ground plane plates 41*a* with material removed from one or the other thereof in areas where components must be mounted in operative association with the mixer circuitry and any other circuitry that may be related thereto. In any event, it is of significant interest that the hybrid signal ring 18 employs reduced width copper clad conductive material in the ring for proper impedance match with the transmission line 16 and the input signal connection from probe structure 14, and in delivering signal output to carrier lines 28 and 29 to the mixer diodes 22 and 23. The hybrid signal ring 18 shown is a "rat race" causing 180° phase shift between signal carrying output legs 28 and 29 feeding the mixer diodes 22 and 23 with the signal input from probe structure 14 and the signal carrying output legs 28 and 29 as well as the local oscillator signal input connection from transmission line 16 are all spaced at substantially 60° around the hybrid ring 18. Further, the effective operational center location of capacitive signal coupling end head 21 of auxiliary signal input and output circuit 19 is spaced substantially 60° from the local oscillator input connection to the hybrid signal ring 18 and 180° from the signal input connection from signal input probe structure 14. Please note that this additional input and output device is quite useful for testing purposes and does not cause any significant interference or disturbance detrimental to mixer performance since it is decoupled by a factor of approximately 25 db below the normal input signal level. Further, this auxiliary signal input circuit is capacitively coupled to the hybrid ring 18 of the mixer circuit 12** at a position where it is not necessary to overcome the isolation in the hybrid. Coupling loss reflected therefrom into the mixer circuit 12 is changed through changing the probe head spacing and conductor area in proximity to the hybrid ring. Coupling of this auxiliary signal input into the mixer is reciprocal so a portion of the normal signal input will be coupled out into the auxiliary circuit. It should be noted, however, that the coupling value of 25 db applies in either direction so the representative loss of the signal power is approximately 1/300 of the mixer signal power involved, a factor so low at this point as to be relatively insignificant.

It does appear that set forth conditions have been met and desired objectives have been achieved in the advantageously useful very low noise mixer design presented with IF currents flowing from the IF side through the mixer diodes and terminated by low impedance on the RF sides of the diodes, and, advantageously, substantially no IF current flow into the RF circuits. In reverse, in much the same manner, RF currents flow from the RF side of the mixer through the mixer diodes to substantially completely effective termination on the IF side of the diodes through relatively low RF impedance IF side terminations. These RF currents terminated on the IF side are composed of the fundamental input signal plus the lower order harmonics generated by the mixer diodes. These harmonics are contained in the region of the mixer diodes on the RF side by the two-stub harmonic filters and also by the grounded stub that also serves as the IF return, with both being as close as possible to the respective diode input terminals. The RF signal frequency and the second harmonic see a low impedance at the mixer diode IF output terminals via the operational action circuit-wise of the Y-shaped stub assemblies that may also be T-shaped or other suitable configuration. Please note again that this low impedance is effectively presented at the diode terminals from each of the two IF side RF reactive stubs through the action of, in effect, a short single section of 50 ohm transmission line separating the two stubs in each stub section in order that each stub acts independently and presents the same electrical resistance point at the diode terminals. This permits connection of the diode terminal reliably at the low RF impedance location with respect to each two stub unit and provides the least amount of RF coupling to the IF leads thereby.

It is of particular interest that the interconnection on the IF side of the diode mixer includes RF short to RF open interconnects via low impedance to high impedance circuit path interconnects of an impedance non-matched nature that optimize beneficially the reflective characteristics generated by mismatch interconnect further optimizing the interconnect operational benefits inherent in the circuit. Beginning at the RF rejection filter where a low RF impedance at the signal frequency exists and where the IF jumper lead to the nearby IF amplifier is attached, a high impedance line approximately a quarter wavelength long at the signal frequency is provided as an input connection thereto. This high impedance line is a very high impedance at its end because of the impedance inverting property of a quarter wavelength of line. The open circuited end of a low impedance line approximately a quarter wavelength long is attached to the end of the high impedance line with the low impedance line being in turn a very low impedance a quarter wavelength away where two high impedance lines, one from each mixer diode, are attached. Both of these additional high impedance lines are approximately one-quarter wavelength long, that is, of the RF input signal and they present a very high RF impedance at the output terminals of each mixer diode. The action of this high impedance with the high impedance lines combined with the low impedance from the Y-shaped stubs results in negligible passage of RF energy into the IF leads. Furthermore, it is important to note that the high impedance IF lines also present a high impedance at the mixer diode terminals not only at the signal frequency but also at all harmonics of the signal frequency with minimal loss of RF energy into the IF lines thereby being achieved. These two high impedance lines attached to the mixer diode output terminals also serve in other ways in that they cause the diode dc current components to be substantially equal for both diodes through providing a closed path of relatively low dc resistance on the diode outputs, and this is with the mixer hybrid RF circuit portion forming a closed low dc resistance path at the diode inputs. With the reversed orientation of the diodes current is allowed to flow from one diode through the other with the desired necessary phase relationship also provided to combine the IF outputs from each diode. Further, since it is unnecessary to complete the dc path of the diodes in an external circuit protection is provided for the mixer diodes. Please note further, that there is an optimum length for the two high impedance lines connected to the diode output terminals to minimize the noise figure and that these lengths may not be exactly a quarter wavelength and typically are approximately 0.2 wavelength long. These line lengths optimize the phase relationship of the fundamental and harmonic currents between the two mixer diodes.

Whereas this invention is herein illustrated and described with respect to a specific embodiment hereof, it should be realized that various changes may be made without departing from the essential contributions to the art made by the teachings hereof.

I claim:

1. In a microwave balanced mixer circuit, a microwave signal two input combiner and signal divider circuit with two outputs; two reverse oriented mixer diodes connected to the two outputs of said combiner and divider circuit; IF circuit diode output combining means connected to the IF side electrodes of said diodes and providing dc circuit path means between said diodes; first duplicate second harmonic band reject filter means each adjacent to and connected individually to the inputs of the respective said mixer diodes; duplicate RF reactive stubs substantially one-quarter of an RF input signal wavelength long connected respectively to the IF output electrode of each of said mixer diodes; and second duplicate second harmonic band reject filter means each adjacent to and connected individually to the outputs of the respective said mixer diodes; duplicate RF input signal quarter wavelength stubs each adjacent to and connected to the input of one of said mixer diodes; and with the outer ends of said quarter wavelength stubs connected to a voltage potential reference source, whereby signal to noise ratio performance is greatly enhanced.

2. The microwave balanced mixer circuit of claim 1, wherein each of said first duplicate harmonic band reject filter means includes two one-eighth of an input RF signal wavelength long stubs spaced approximately three-sixteenths of an input RF signal wavelength apart.

3. The microwave balanced mixer circuit of claim 2, wherein the two stubs of each of said first duplicate harmonic band reject filter means project to opposite sides from their respective base connections with the respective circuit conductor of the two signal outputs of said two signal input and two signal output divider RF circuit means.

4. The microwave balanced mixer circuit of claim 1, wherein said IF circuit diode output combining means includes: a low impedance IF signal combining stub; two RF high impedance lines connecting the IF output of the respective mixer diodes to said IF signal combining stub; and with said IF signal combining stub and said two RF high impedance lines all substantially one-quarter of an input RF signal wavelength long.

5. The microwave balanced mixer circuit of claim 4, wherein said IF signal combining stub has, an RF short end connected to said two RF high impedance lines connecting IF output of the mixer diodes to the IF signal combining stub, and an RF open end; RF short means in the IF signal output circuit path; and a third RF high impedance line connecting the RF open end of said IF signal combining stub to said RF short means.

6. The microwave balanced mixer circuit of claim 5, wherein said RF short means is an RF rejection filter.

7. The microwave balanced mixer circuit of claim 6, wherein said RF short means has an RF short to ground base;

and connection of said RF short to ground base to IF utilizing circuit means.

8. The microwave balanced mixer circuit of claim 5, wherein said microwave signal two input combiner and two signal output divider RF circuit means is a microwave hybrid ring with spacing of the two input connections to the hybrid ring and spacing of the two output connections from the ring being of substantially equal spacing about the ring.

9. The microwave balanced mixer circuit of claim 8, wherein one of said two input connections to the hybrid ring is positioned midway between the two output connections of the hybrid ring.

10. The microwave balanced mixer circuit of claim 9, wherein spacing of the two input connections and also of the two output connections of the hybrid ring is substantially equal to one half of the RF input signal wavelength.

11. The microwave balanced mixer circuit of claim 10, wherein an auxiliary signal input-output probe is capacitively coupled to said hybrid ring at a location on the ring where it is unnecessary to overcome isolation in the hybrid ring.

12. The microwave balanced mixer circuit of claim 11, wherein said auxiliary signal input-output probe is capacitively signal coupled to said hybrid ring at a location substantially 180° around the ring from one of said two RF input connections to the hybrid ring.

13. The microwave balanced mixer circuit of claim 1, wherein said two RF reactive stubs are, respectively, connected in common with individual, respective, units of said second duplicate second harmonic band reject filter means.

14. The microwave balanced mixer circuit of claim 13, wherein one of said second duplicate second harmonic band reject filter means is in the form of an RF input harmonic reactive stub projecting from a diode connective base common to one of said RF reactive stubs.

15. The microwave balanced mixer circuit of claim 14, wherein there is a notch between said stubs projecting from said diode connective base.

16. The microwave balanced mixer circuit of claim 14, wherein said mixer circuit is in the form of microwave microstrip circuitry on micro-strip board.

17. The microwave balanced mixer circuit of claim 14, wherein said mixer circuit is in the form of microwave stripline.

* * * * *